US005633885A

United States Patent [19]
Galvanauskas et al.

[11] Patent Number: 5,633,885
[45] Date of Patent: May 27, 1997

[54] FREQUENCY CHIRP CONTROL AND COMPENSATION FOR OBTAINING BROAD BANDWIDTH ULTRASHORT OPTICAL PULSES FROM WAVELENGTH-TUNABLE LASERS

[75] Inventors: Almantas Galvanauskas; Donald J. Harter, both of Ann Arbor, Mich.

[73] Assignee: Imra America, Inc., Ann Arbor, Mich.

[21] Appl. No.: 312,912

[22] Filed: Sep. 29, 1994

[51] Int. Cl.$^6$ ........................................ H01S 3/10
[52] U.S. Cl. ............................................. 372/25
[58] Field of Search ................................. 372/25, 21

[56] References Cited

U.S. PATENT DOCUMENTS

| | | | |
|---|---|---|---|
| 4,655,547 | 4/1987 | Heritage et al. | 359/559 |
| 4,746,193 | 5/1988 | Heritage et al. | 359/559 |
| 4,928,316 | 5/1990 | Heritage et al. | 455/600 |
| 4,953,939 | 9/1990 | Epworth | 385/15 |
| 5,017,806 | 5/1991 | Edelstein et al. | 372/21 |
| 5,130,994 | 7/1992 | Madey et al. | 372/25 |
| 5,185,750 | 2/1993 | Kafka et al. | 372/18 |
| 5,212,698 | 5/1993 | Kafka et al. | 372/25 |
| 5,265,107 | 11/1993 | Delfyett | 372/25 |
| 5,289,114 | 2/1994 | Nakamura et al. | 324/96 |
| 5,303,079 | 4/1994 | Gnauck et al. | 385/8 |
| 5,305,336 | 4/1994 | Adar et al. | 372/96 |
| 5,321,718 | 6/1994 | Waarts | 372/23 |
| 5,365,366 | 11/1994 | Kafka et al. | 372/21 |
| 5,400,350 | 3/1995 | Galvanauskas | 372/25 |

OTHER PUBLICATIONS

Fork et al., "Compression of Optical Pulses to Six Femtoseconds by Using Cubic Phase Compensation," *Optics Letters*, vol. 12, No. 7, Jul. 1987, pp. 483–485.

Hofer et al., "Mode Locking with Cross-Phase and Self-Phase Modulation," *Optics Letters*, vol. 16, No. 7, Apr. 1, 1991, pp. 502–504.

Delfyett et al., "200–fs Optical Pulse Generation and Intracavity Pulse Evolution in a Hybrid Mode–Locked Semiconductor Diode–Laser/Amplifier System" *Optics Letters*, vol. 17, No. 9, May 1, 1992, pp. 670–672.

Duguay et al., "Compression of Pulses from A Mode–Locked He–Ne Laser," *Applied Physics Letters*, vol. 14, No. 1, Jan. 1, 1969, pp. 14–16.

Kafka et al., "Picosecond and Femtosecond Pulse Generation in a Regeneratively Mode–Locked Ti: Sapphire Laser," *IEEE Journal of Quantum Electronics*, vol. 28, No. 10, Oct., 1992, pp. 2151–2162.

Li et al., "Broadband Cubic–Phase Compensation with Resonant Gires–Tournois Interferometers," *Optics Letter*, vol. 14, No. 9, May 1, 1989, pp. 450–452.

Stingl et al., "Generation of 11–fs pulses from a Ti:Sapphire Laser Without the Use of Prisms," *Optics Letters*, vol. 19, No. 3, Feb. 1, 1994, pp. 204–209.

Galvanauskas et al., "Real–Time Picosecond Electro–Optic Oscilloscope Technique Using a Tunable Semiconductor Laser," *Applied Physics Letters*, vol. 60, No. 2, Jan. 13, 1992, pp. 145–147.

(List continued on next page.)

*Primary Examiner*—Rodney B. Bovernick
*Assistant Examiner*—Robert E. Wise
*Attorney, Agent, or Firm*—Sughrue, Mion, Zinn, Macpeak & Seas

[57] ABSTRACT

A method of, and apparatus for controlling and compensating for high order frequency chirp in a fast tuned laser. Optical means in the form of chirped Bragg gratings, preferrably in-fiber gratings, are used to compensate for one or more orders of the frequency chirp. Alternatively, or in combination with the optical compensation, an electrical compensation scheme employs integrators in one or more parallel compensation channels to create a composite compensation signal to compensate for specific order nonlinearities. The present invention allows for the generation of shorter bandwidth-limited optical pulses with spectra containing the complete tuning range of the tunable laser.

32 Claims, 9 Drawing Sheets

OTHER PUBLICATIONS

Galvanauskas et al., "Generation of Femtosecond Optical Pulses with Nanojoule Energy From a Diode Laser and Fiber Based System," *Applied Physics Letters*, vol. 63, No. 13, Sep. 27, 1993, pp. 1742–1744.

Galvanauskas et al., "Hybrid Diode–Laser Fiber–Amplifier Source of High–Energy Ultrashort Pulses," *Optics Letters*, vol. 19, No. 14, Jul. 15, 1994, pp. 1043–1045.

Ouellette, "Dispersion Cancellation Using Linearly Chirped Bragg Grating Filters in Optical Waveguides," *Optics Letters*, vol. 12, No. 10, Oct., 1987, pp. 847–849.

Kashyap et al., "Novel Method of Producing All Fibre Photoinduced Chirped Gratings," *Electronics Letters*, vol. 30, No. 12, Jun. 9, 1994, pp. 996–997.

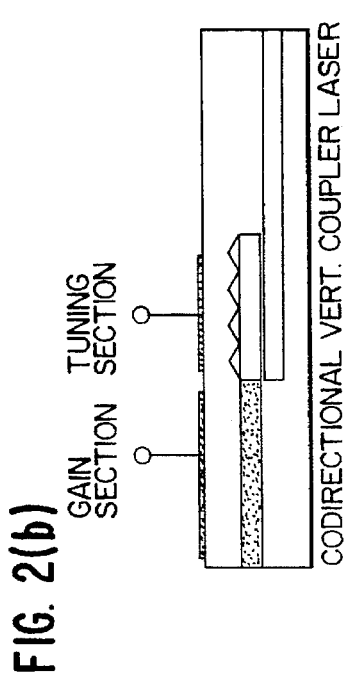
FIG. 2(a) THREE-SECTION DBR
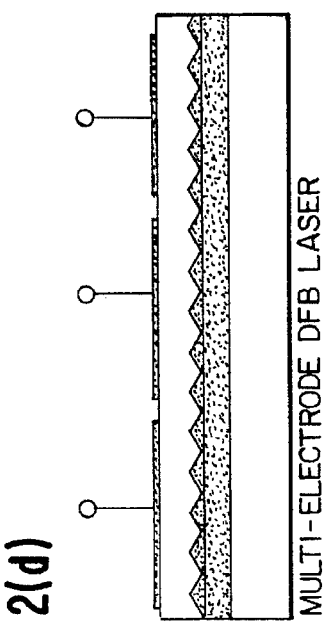
FIG. 2(b) CODIRECTIONAL VERT. COUPLER LASER
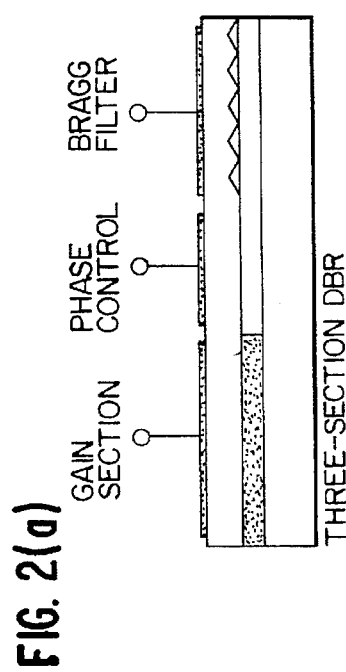
FIG. 2(c) PHASE TUNABLE DFB
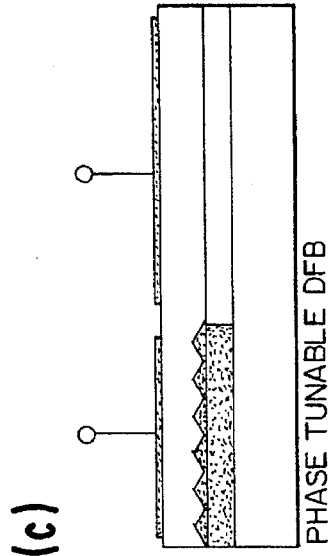
FIG. 2(d) MULTI-ELECTRODE DFB LASER
FIG. 2(e) TUNABLE TWIN GUIDE LASER
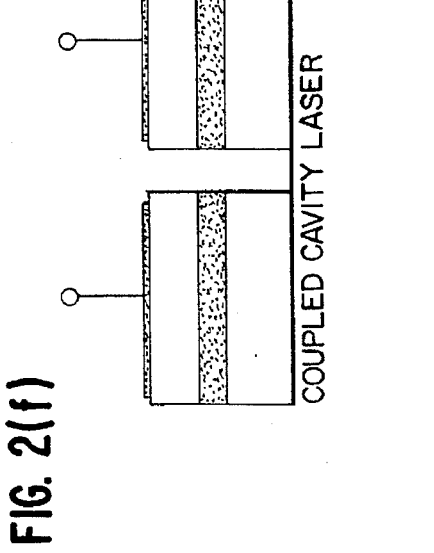
FIG. 2(f) COUPLED CAVITY LASER
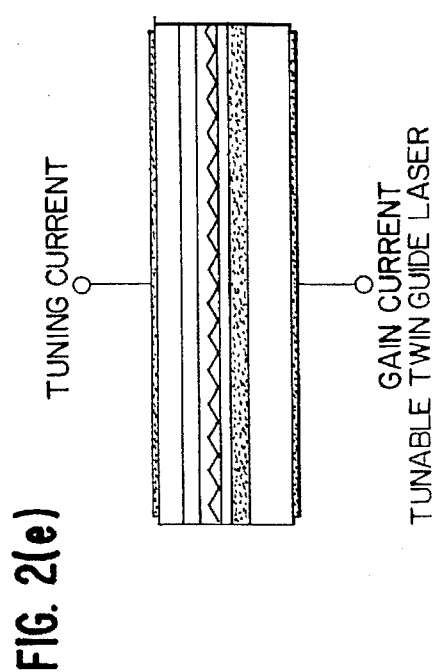

FREQUENCY CHIRP CONTROL AND COMPENSATION FOR OBTAINING BROAD BANDWIDTH ULTRASHORT OPTICAL PULSES FROM WAVELENGTH-TUNABLE LASERS

FIELD OF THE INVENTION

The present invention is directed to optical signal processing and more particularly to a method of, and apparatus for controlling and compensating for high order chirp nonlinearities in an optical signal.

BACKGROUND OF THE INVENTION

A bandwidth limited pulse is the shortest pulse for a given spectrum, and is characterized in that all of its spectral components overlap in time (have the same phase). The duration $\Delta\pi$ of a bandwidth limited pulse is inversely proportional to the width of its frequency spectrum $\Delta v: \Delta\tau \propto 1/\Delta v$. Non-bandwidth limited pulses have a frequency chirp, which has to be compensated to obtain bandwidth limited pulses. The existing compensation techniques deal mostly with pulses from mode-locked lasers. In mode-locked laser systems, chirp control and compensation is accomplished by using dispersive delay lines inside or outside the laser cavity. For this purpose prisms, diffraction gratings, Gires-Tournois interferometers, or multilayer mirrors are used inside or outside the laser cavity. One example of chirp compensation is reported in Fork et al., Opt. Lett. 12, 483 (1987), which is hereby incorporated by reference herein. A diffraction grating pair and a four prism arrangement outside the laser with respective first and second order dispersions of ~1000 $fs^2$ and ~1000 $fs^3$ were used to compensate the linear and quadratic frequency chirp. Another example in A. Stingl et al., Opt. Lett. 19, 204 (1994), which is hereby incorporated by reference herein, reports the use of specifically designed multilayer mirrors to compensate for the frequency chirp inside the cavity of a mode-locked Ti:sapphire laser. This allows first order chirp to be eliminated. The magnitude of the dispersion is ~50 $fs^2$ and is sufficient to achieve bandwidth-limited pulses of <14 fs with the spectral width of >60 nm. The ultimate achievement of these techniques was the generation of the shortest optical pulses, which are only 6–10 fs long and contain just a few optical cycles.

As discussed in Galvanauskas et al., El. Lett. 27, 2394 (1991), which is hereby incorporated by reference herein, Galvanauskas et al., Appl. Phys. Lett. 63, 1742 (1993), which is hereby incorporated by reference herein, and Galvanauskas et al., Opt. Lett. 19, 1043 (1994), which is hereby incorporated by reference herein, recent development of compact tunable lasers (e.g., three-section distributed Bragg-reflection, three-section distributed feedback, tunable twin guide, vertical-coupler, coupled-cavity laser diodes, etc.) have triggered the development of a new short pulse generation technique. This technique uses a fast tuning of the emission wavelength of a tunable laser to obtain broad bandwidth pulses, which can be compressed down to ultrashort durations. Systems using this technique have a number of properties such as robustness, compactness, reliability, arbitrary pulse repetition rate, high pulse energies and relatively low cost, which makes them an interesting and promising alternative to conventional mode-locked lasers. In the past, the demonstrated bandwidth of continuous tuning was ~10 nm. However, the potential tuning range is as broad as the gain bandwidth of the laser medium and can exceed 100 nm, which corresponds to a bandwidth-limited duration of less than 100 fs.

The potential broad tuning range has not before been fully utilized, because the chirp nonlinearity of the pulses from a tunable laser is high, and the conventional techniques fail to compensate such chirp. In Galvanauskas et al., Opt. Lett. 19, 1043 (1994), it was demonstrated experimentally that only 1–2 nm bandwidth pulses can be compressed down to the bandwidth limit (~2 ps pulse duration) when a three-section DBR laser diode and a diffraction grating pair compressor are used. With additional nonlinear compression these pulses could be further shortened down to 230 fs, but the quality of the pulses is lost, in that broad pedestals and satellite pulses appear.

Fast Tuning Techniques and Chirp Nonlinearities

With fast tuning techniques, chirped pulses are generated directly from a tunable laser and compressed outside the laser cavity, as shown in FIG. 1. In general, a continuously-tunable laser contains a gain element, a phase modulator to shift the emission frequency and a tunable narrow-band filter to allow only one longitudinal mode in the cavity. To attain fast tuning, the laser cavity should be sufficiently short and the speed of the phase modulator and the tunable filter should be sufficiently high. The chirp duration can be ~1 ns so that compression with a dispersive delay line (e.g., diffraction gratings or a standard optical fiber) would be easy. Such speed can be attained by electrical means, see A. Galvanauskas et al., Appl. Phys. Lett. Vol. 63, p. 1742–1744, 1993.

One example is a three-section tunable laser diode shown in FIG. 2a. Other possible tunable structures are also shown in FIG. 2b–f, which differ from each other via the combination of the three basic components. At present, all existing structures which can be fast wavelength tuned are semiconductor laser diodes. Wavelength tuning is performed by changing the refractive index of a semiconductor material either by varying the carrier concentration (carrier injection) or by using the electrooptic effect. In principle, other types of tunable compact laser structures, e.g., short cavity fiber lasers, waveguide lasers, and compact solid-state lasers can also be developed using integrated electrooptical, carrier-injection or other types of electrically controlled modulators and filters.

It is useful to define the chirp nonlinearity. The instantaneous frequency of a chirped pulse can be expanded into the power series:

$$\omega(t)=\omega_0+\omega_1 t+\omega_n t^2+\omega_3 t^3+ \qquad (1)$$

Here $\omega_0$ is the central frequency of the pulse, which for a bandwidth-limited pulse, should be $\omega(t) \equiv \omega_0$. Other terms, which should be absent in a bandwidth limited pulse, correspond to the first, second and higher orders of the frequency chirp respectively.

If the chirped pulses, which are generated by the fast tuning, would have only the linear term in the decomposition equation (1), bandwidth-limited pulses would be easy to attain with any linear dispersive delay line. However, a number of processes inside the cavity of a tunable laser add higher order chirp terms and typically the magnitudes of these terms are too high to be compensated by standard means.

SUMMARY OF THE INVENTION

It is an object of the present invention to introduce new techniques for compensating the nonlinear frequency chirp from a fast-tuned laser. It is another object of the present invention to provide for the generation of pulses with much shorter durations than before. It is a further object of the present invention to obtain bandwidth-limited pulses with spectra containing the complete tuning range of a tunable laser.

The present invention accomplishes these and other significant objectives by controlling the chirp and compensating for the higher order chirp nonlinearities by using nonlinear frequency tuning and/or specifically designed nonlinearly dispersive elements inside or outside the laser cavity.

BRIEF DESCRIPTION OF THE DRAWINGS

In order that the invention be fully understood, a preferred embodiment will now be described with reference to the accompanying drawings, in which:

FIGS. 2a–f show various laser structures suitable for fast wavelength tuning;

DETAILED DESCRIPTION OF THE PREFERRED EMBODIMENT

Figure 1:
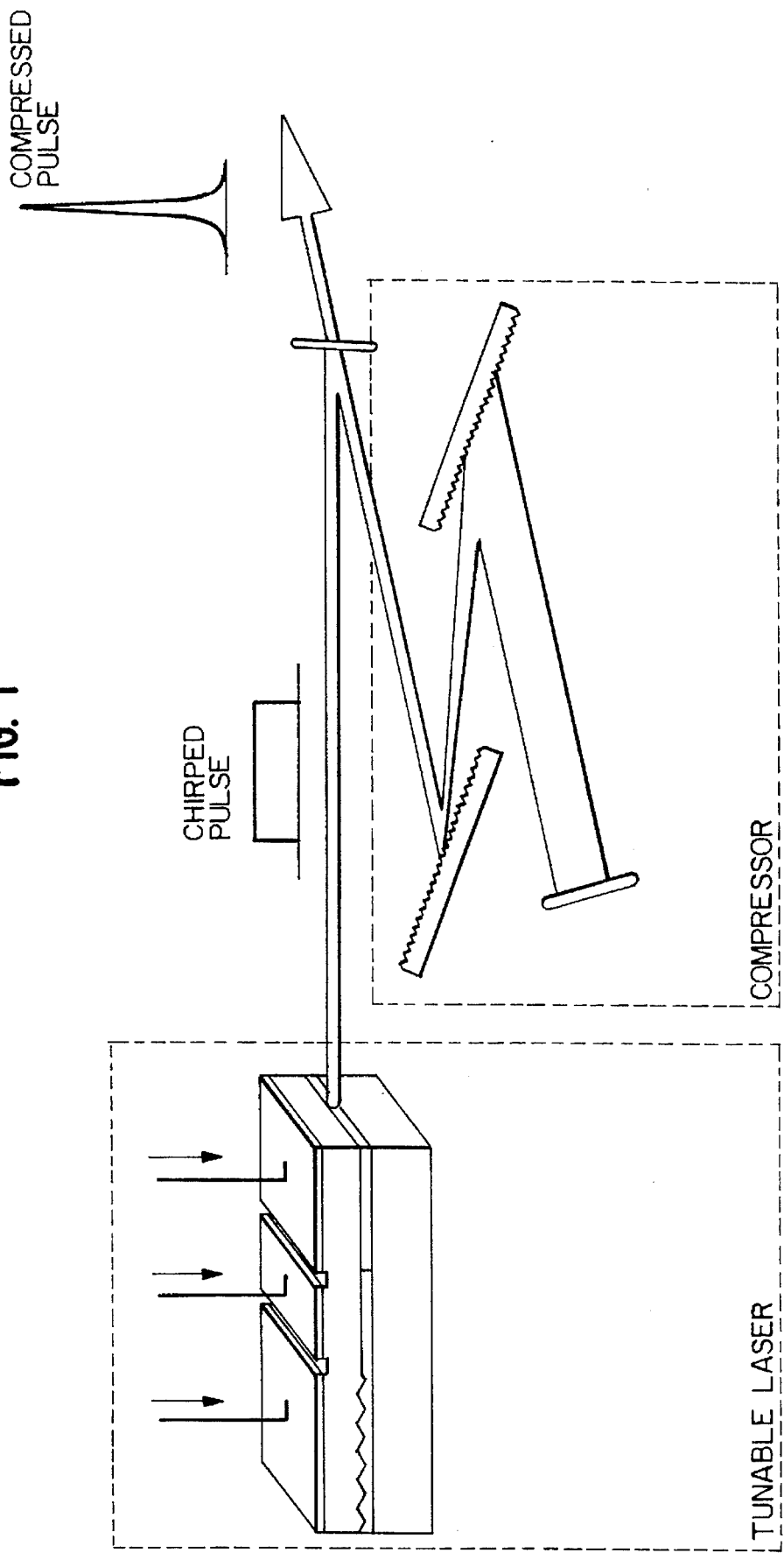
FIG. 1 is an illustration of the generation of ultrashort pulses using fast wavelength tuning.
Figure 3:
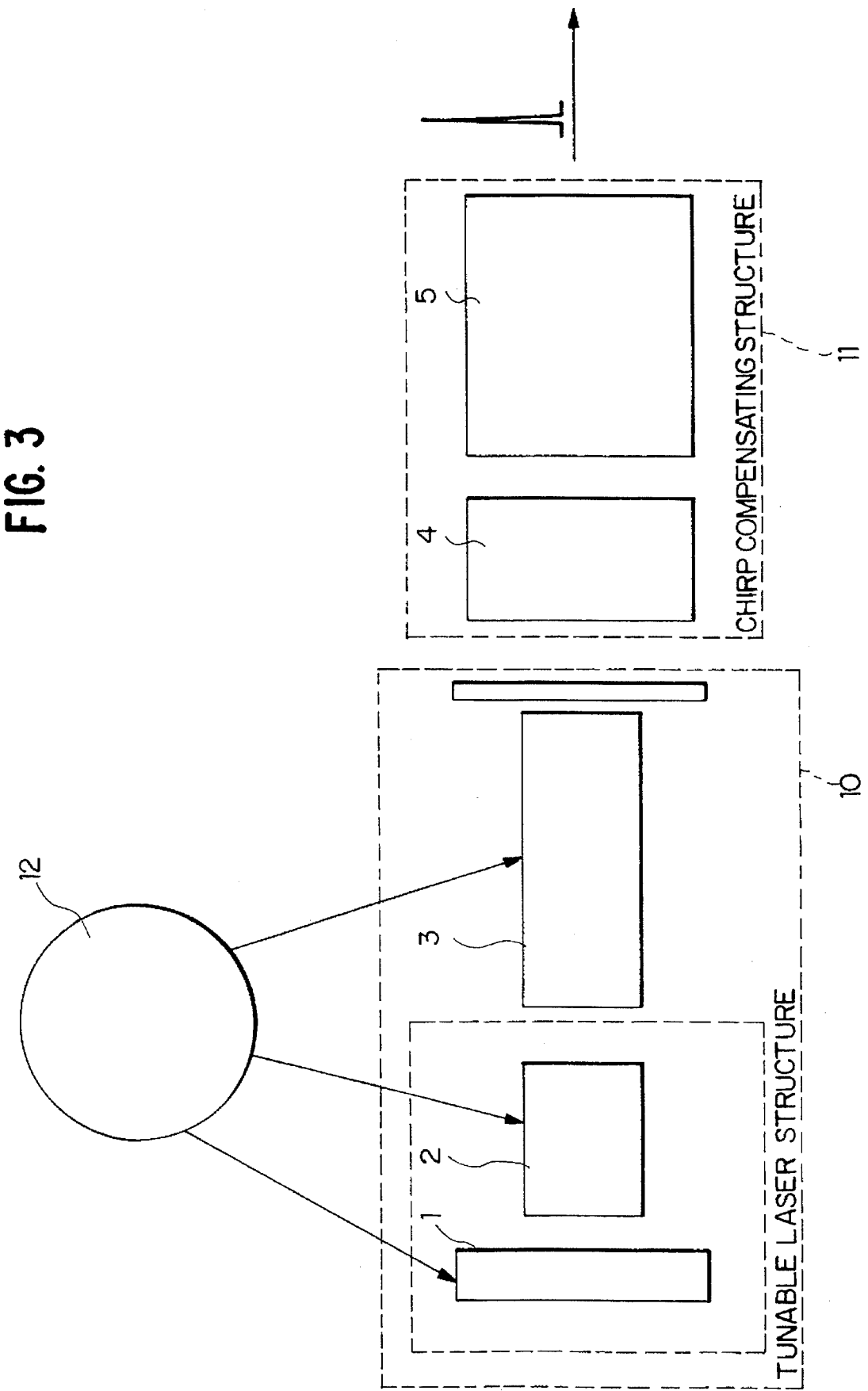
FIG. 3 is a schematic of an arrangement in accordance with the present invention, for frequency chirp control and compensation.

As shown in FIG. 3, the general arrangement of the preferred embodiment consists of a controller 12, a tunable laser 10 and dispersive components either inside or outside the laser cavity such as the chirp compensation structure 11. The tunable laser 10 comprises a narrow band reflecting filter 1, phase modulator 2, and laser gain medium 3, while the chirp compensation structure 11 has a nonlinear dispersion component 4 and a linearly dispersive compressor 5.

In Galvanauskas et al., El. Lett. 27, 2394 (1991), and Galvanauskas et al., Appl. Phys. Lett. 63, 1742 (1993), fast tuning was demonstrated using nanosecond electric pulses with a subnanosecond rise-time. In order to control the nonlinear frequency chirp, more complex electric tuning has to be accomplished. For an electrically tuned device, the tuning voltage should have the shape:

$$V(t)=a_0+a_1t+a_2t^2+a_3t^3+ \quad (2)$$

Then by proper choice of the magnitudes of terms in equation (2), nonlinear terms in the chirp expansion (1) can be compensated.

The required waveform represented by equation (2) for controlling the chirp nonlinearities can be obtained with specially designed pulse shaping techniques. First, electric step-like pulses with very fast rise time and a longer duration should be generated, such as electric pulses with 300–600 ps rise times and 2–3 ns durations. Then, broad bandwidth electrical integrators can/be used to shape the electric waveform. By connecting integrators in series, any desired term in the expansion equation (2) can be obtained. For example, by integrating a step-like pulse, a linear increase is obtained; by integrating this linear increase, a quadratic increase is formed, etc.

Figure 4:
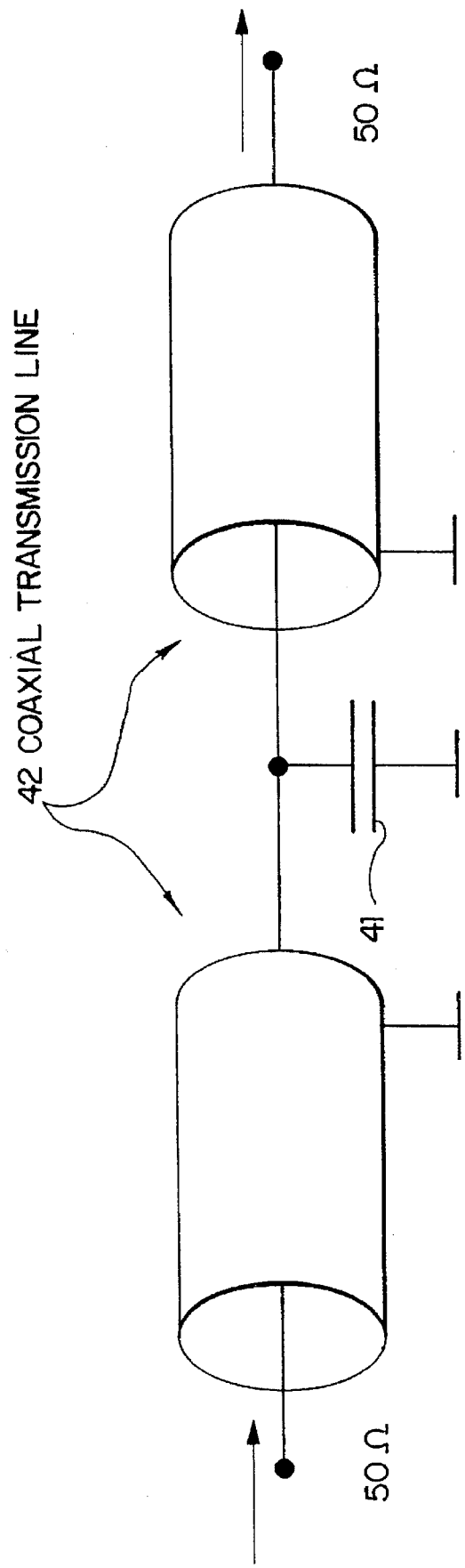
FIG. 4 shows an example of a broad-bandwidth electric integrator.
Figure 5A:
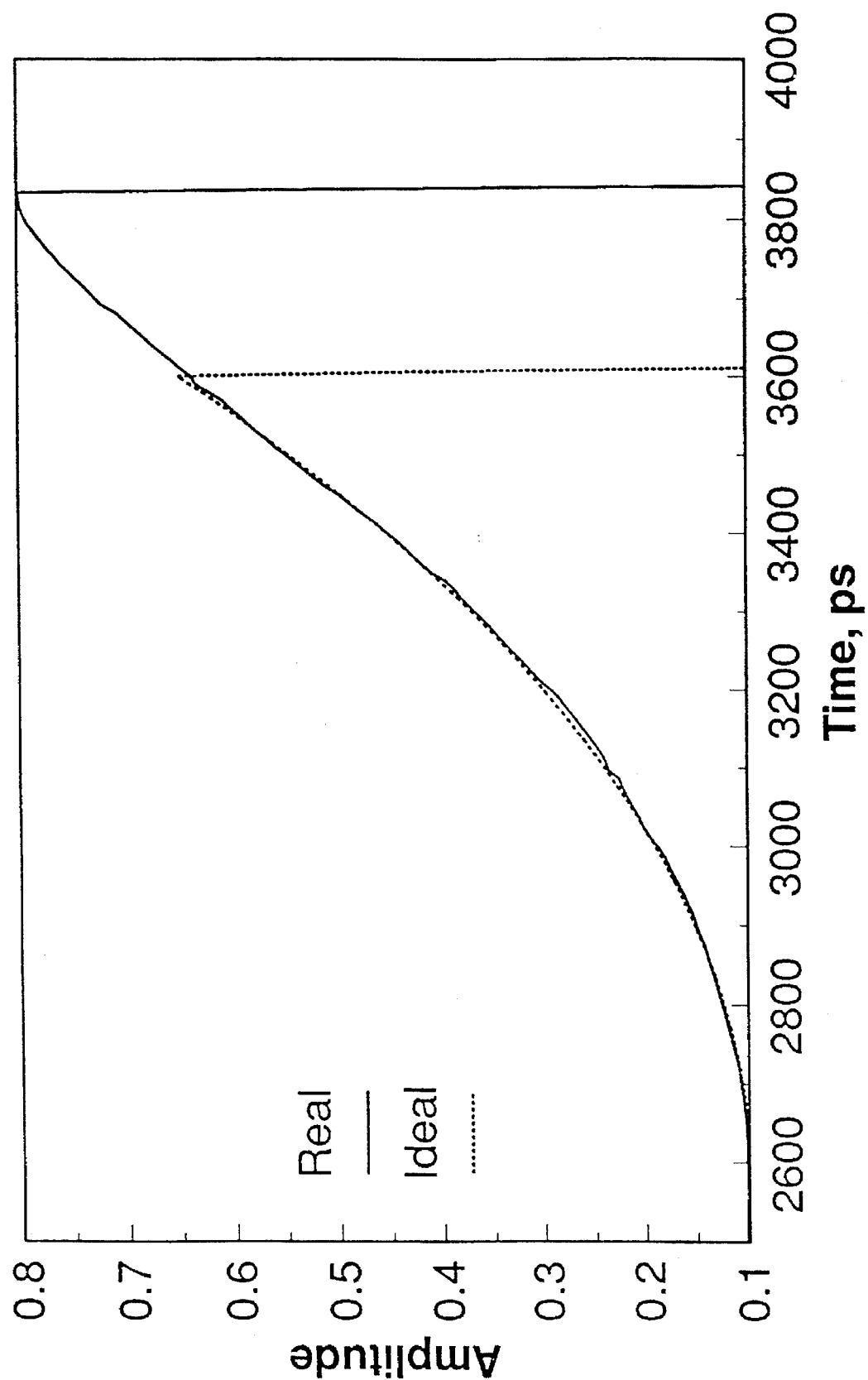
FIG. 5a is a graphical representation of examples of synthesized quadratic electric waveforms.
Figure 5B:
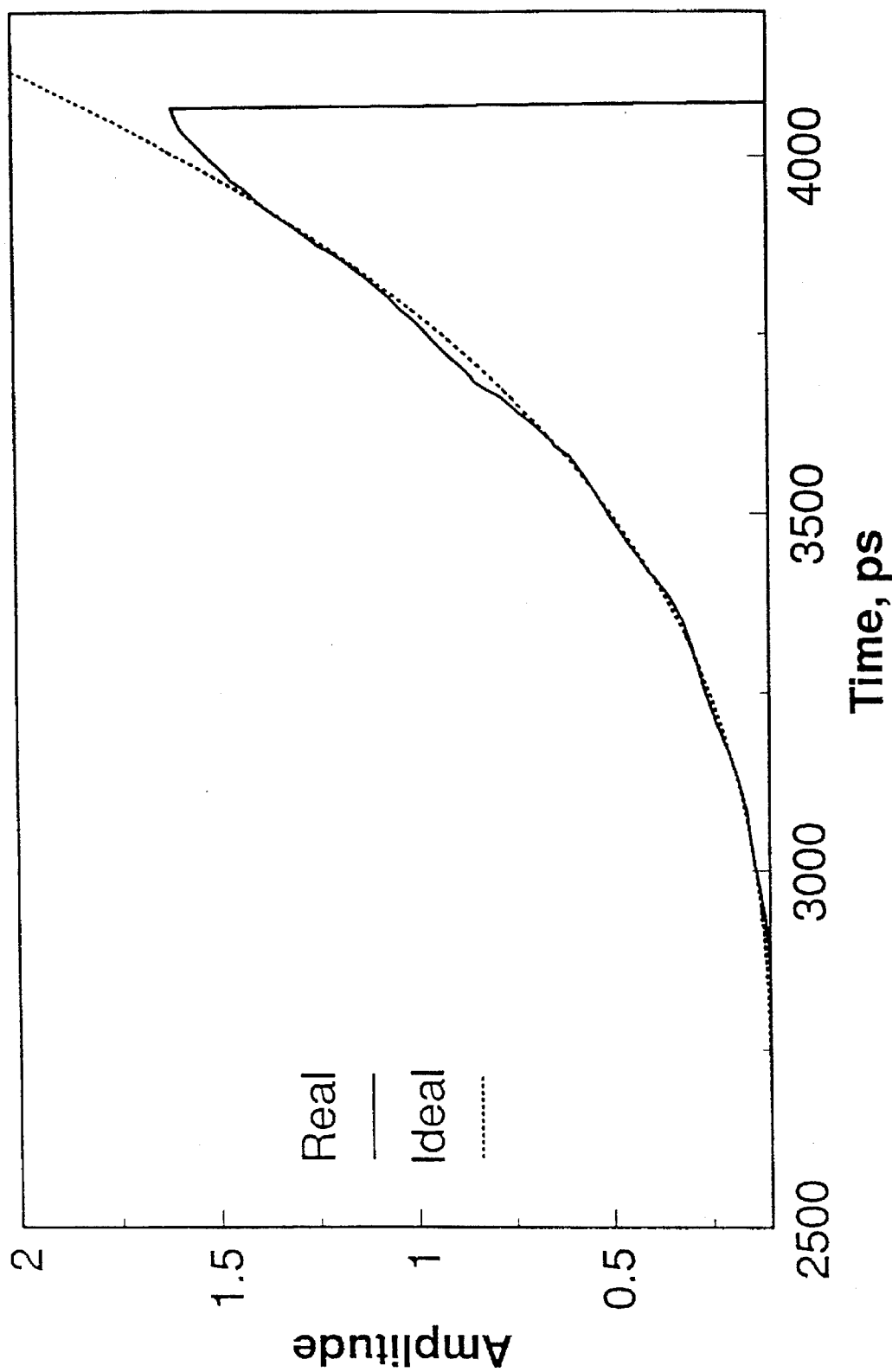
FIG. 5b is a graphical representation of examples of synthesized cubic electric waveforms.

FIG. 4 shows one example of a broad-bandwidth integrator which is a circuit having a capacitor 41 connected in parallel with a coaxial transmission line 42. For 0.5 to 2 ns pulse shaping, the capacitor values should range from ~1 to 20 pF. FIG. 5 shows examples of quadratic and cubic electric waveforms obtained experimentally with such integrators, where the ideal calculated waveforms substantially agree with the experimental results.

Figure 6:
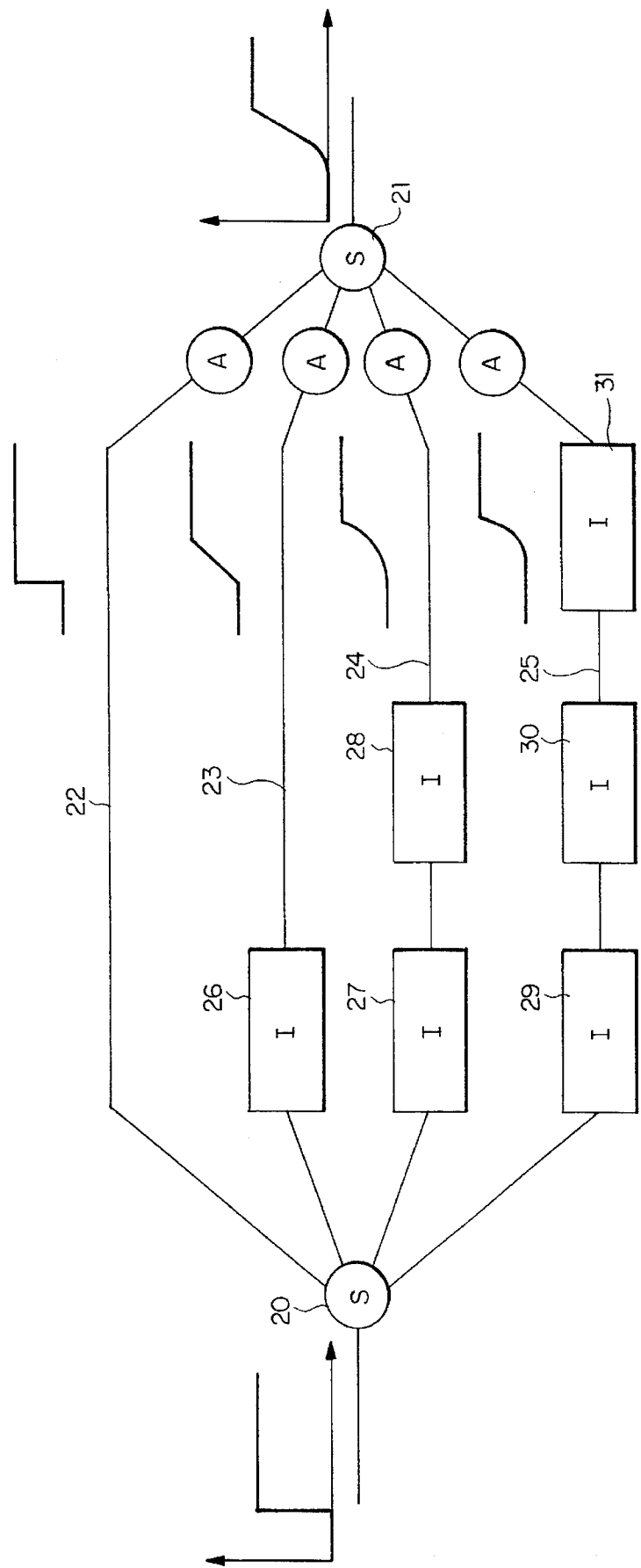
FIG. 6 is a block diagram showing an arrangement for obtaining the arbitrarily shaped electrical waveform.

FIG. 6 shows an example of the realization of a practical waveform shaper in accordance with the present invention. Nanosecond electric pulses with a fast rise time are generated with a pulse generator and split into a number of channels 22–25, such that the number of channels 22–25 is equal to the number of correction orders required. Each of the channels 23–25 contains one or more integrators 26–31 in a given channel connected in series, such that the number of integrators 26–31 determines the order of the correction a particular channel 23–25 is used to control. The final waveform is obtained after combining all the waveforms from each channel 22–25 into one after suitable amplification via amplifiers A, this signal then being used as the driving signal for the laser source. Waveforms can be split and combined with standard RF power splitters 20 and combiners 21. By controlling the magnitude of the electric signal in each of the channels using amplifiers A, the magnitude of each chirp nonlinearity is controlled.

This technique of electric chirp compensation was verified experimentally. Frequency chirped pulses with a wavelength-bandwidth of 4 nm were generated with a three-section DBR laser diode as shown in FIG. 2a. Linear chirp was compensated with a diffraction grating pair, and the remaining chirp was measured with a spectrometer and a streak-camera. It was estimated that to compensate the remaining quadratic chirp, when no electric control of the chirp nonlinearity was used, dispersion of $\sim 10^{12}$ fs$^3$ would be required. Higher order chirp components must also be compensated in this case. When the suitable electric waveform was generated using a construction as in FIG. 6 and used to control the chirp, chirp components with an order higher than two were reduced below the resolution limit of the measurements, and the magnitude of quadratic chirp was reduced by a factor of ~100 100. The estimated quadratic dispersion required to compensate this chirp was $\sim 10^{10}$fs$^3$, which can be obtained with a standard compensation arrangement.

There are other techniques for generating picosecond to nanosecond arbitrarily shaped electric waveforms. For example, a sequence of short (picosecond) pulses can be generated, and the magnitude of each pulse controlled to get the sampled version of the required waveform. Then, by passing this sequence through a filter, a continuous waveform can be obtained.

For optical chirp compensation, dispersive optical components for compensating the frequency-chirp nonlinearities can be used outside or even inside the laser cavity. Optical means can be used as an addition to the electric control to precisely eliminate the remaining chirp, or as the main compensating component. If used in addition to electric control, the requirements on the compensation magnitude and number of orders is eased, and traditional methods with diffraction gratings, prisms, interferometers or multilayer mirrors can be used.

In the second case, where dispersive optical components are used as the main compensatory component(s), new dispersive components with controllable and large nonlinear dispersion are required. This, for example, can be realized using a Bragg grating. For compensating linear chirp, linearly chirped in-fiber Bragg gratings can be used, as discussed in Ouellette, Opt. Lett. 12, 847 (1987), which is hereby incorporated by reference herein. In the invention, nonlinearly chirped Bragg gratings are used to compensate nonlinear frequency chirp. The quadratic chirp profile of a Bragg grating will compensate quadratic frequency chirp, cubic will compensate cubic, etc. By combining such gratings either in series or overlapping them in an optical fiber, the dispersive structure for compensating any nonlinear chirp can be designed and fabricated. The dispersion that can be achieved with a fiber grating is sufficient to compensate for nonlinearly chirped pulses from a fast-tuned laser. The magnitude of the grating dispersion is determined by the length of the grating and the reflection bandwidth. With existing technology, gratings with length ~1 cm and bandwidth of ~10–20 nm have been reported in Kashyap et al., Electr. Lett 30, 996 (1994), which is hereby incorporated by reference herein. These gratings are sufficient to compensate frequency deviation from linear chirp of up to ~100 ps over the bandwidth of up to 10–20 nm. For example, second order dispersion would be approximately $10^{11}$–$10^{12}$ fs$^3$.

Figure 7A:
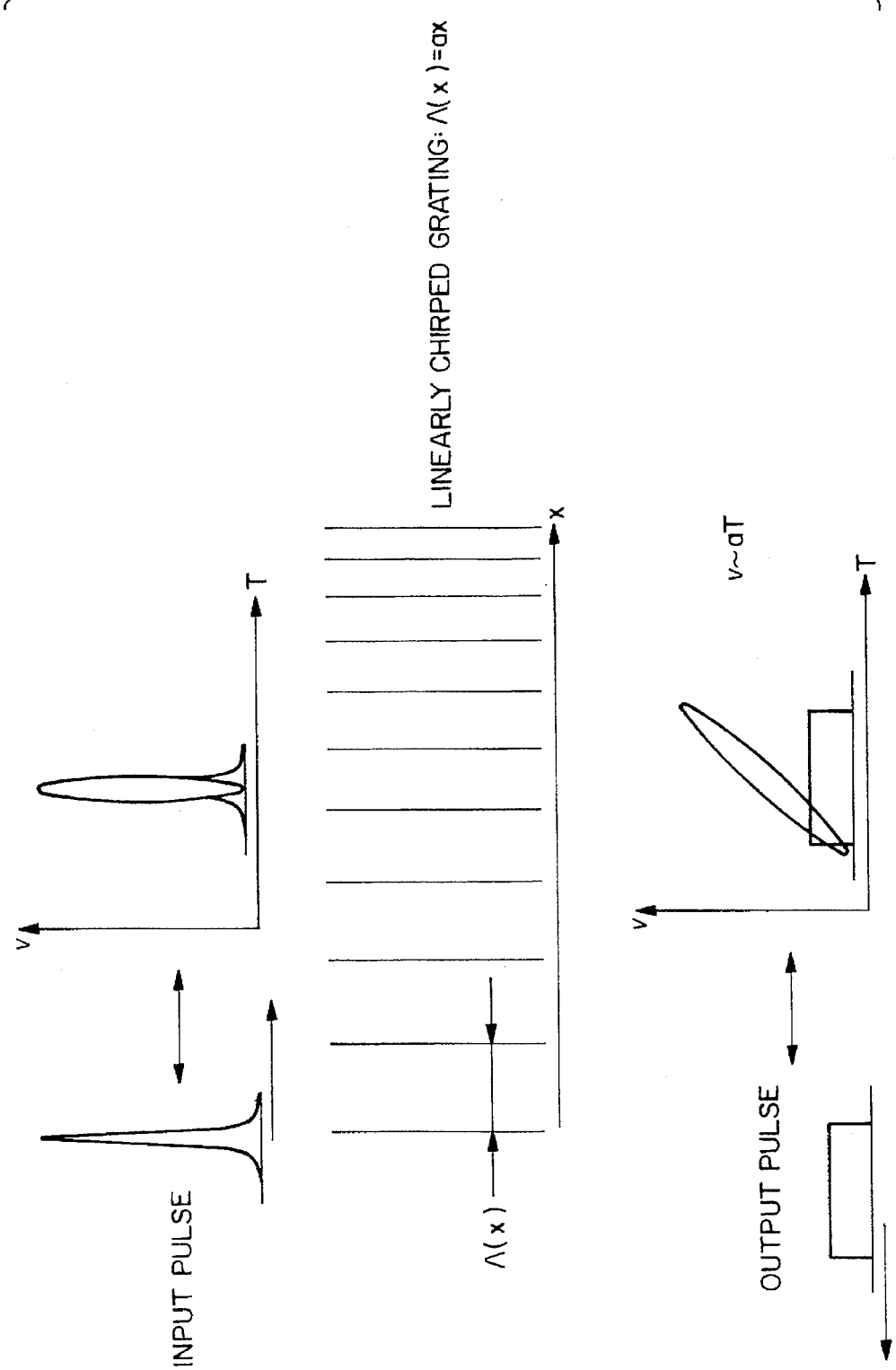
FIG. 7a shows the effect of a linearly chirped Bragg grating on the chirp of reflected pulses.
Figure 7B:
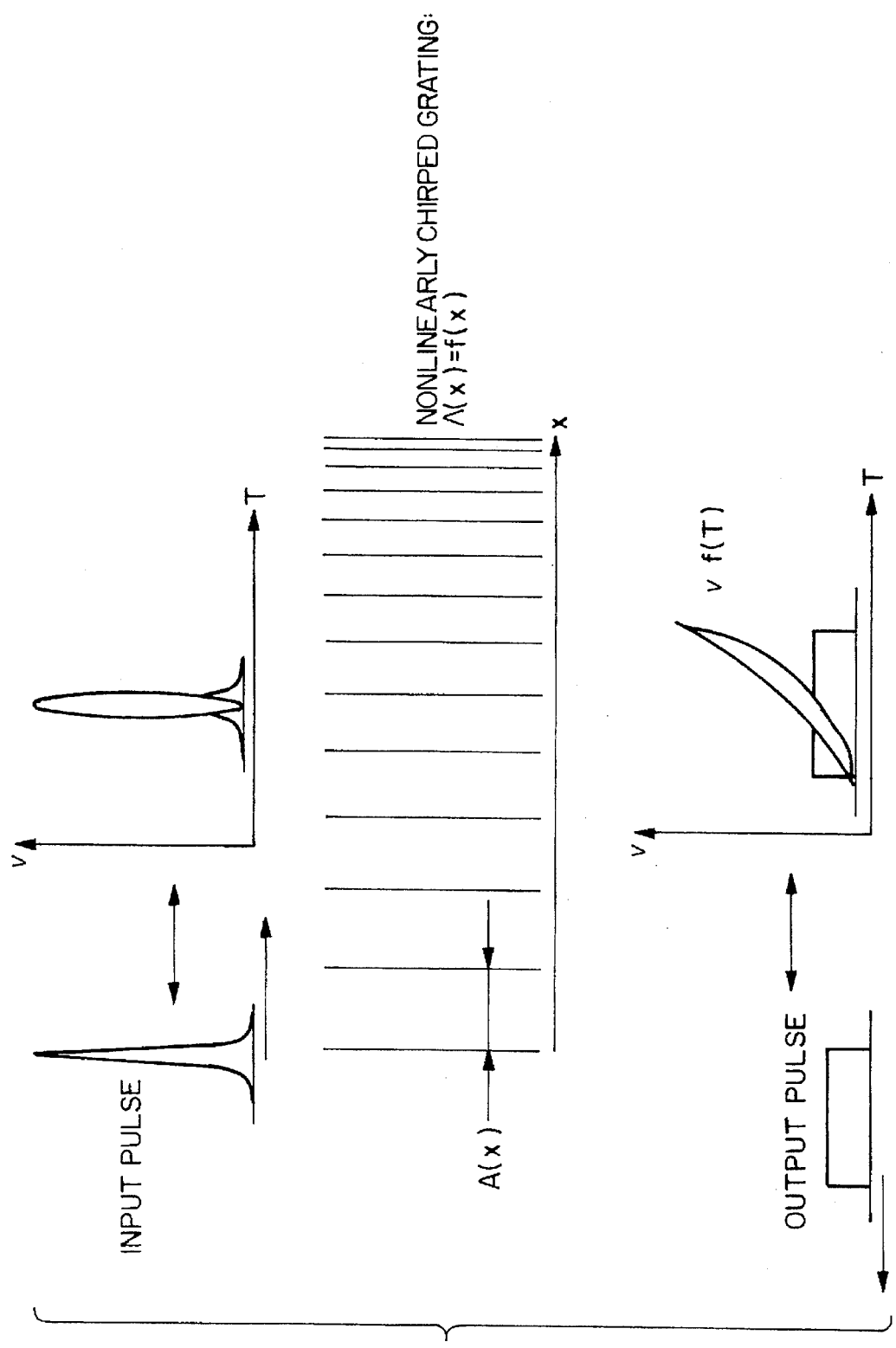
FIG. 7b shows the effect of a nonlinearly chirped Bragg grating on the chirp of reflected pulses.

In FIG. 7(a) and (b) the effect of linearly and nonlinearly chirped Bragg gratings on the frequency $\upsilon$ chirp of reflected optical pulses is shown. Different wavelength components of an optical pulse incident into a chirped Bragg grating are reflected at different longitudinal positions in the grating. For the spectral component with wavelength $\lambda$ the time delay introduced by the grating is $\Delta\tau = 2\Delta L/v_g$. Here $v_g$ is the group velocity of light in the structure and $\Delta L$ is the distance from the beginning of the grating to the position at which the spectral component is reflected. The spectral component $\lambda$ will be reflected at the position x determined by the Bragg condition $\lambda_B = 2n\Lambda(x)$. Here n is the refractive index and $\Lambda(x)$ is position-dependent period of the grating. Therefore, the frequency chirp introduced by such a grating on a broad-bandwidth optical pulse will follow the functional dependence of $\Lambda(x)$. A linearly chirped grating will produce linearly chirped optical pulses, a quadratically chirped grating will induce second order chirp, etc. As a practical example, numerical calculations of the dispersion properties of linearly and quadratically chirped gratings performed by the inventors reveal that for a 2.47 mm long grating with $\Lambda_{aver} = 0.247$ μm and a 15 nm reflection bandwidth at 1.5 μm, linear grating provides linear dispersion of 0.7 ps$^2$ and quadratic grating exhibits second order group-velocity dispersion of ~$10^8$fs$^3$.

Such chirped Bragg gratings can also be implemented in media other than optical fiber, such as waveguides or bulk Bragg gratings. Unchirped in-waveguide Bragg gratings at present are widely used in tunable laser diodes as narrow-band optical filters (e.g., in a three-section DBR or n DFB laser diodes). By introducing nonlinear spatial chirp with quadratic and higher order terms into such a reflector, intracavity compensation of nonlinear chirp can be achieved.

Bulk Bragg gratings can be obtained using acousto-optical modulation where RF electric waveforms induce a periodic variation of the refractive index in an acousto-optic crystal. By controlling the chirp of the RF waveform, a suitably chirped Bragg reflector can be formed for an optical wave propagating along the direction of the acoustic wave. The advantage of such a chirp compensation method is that the magnitude of the chirp nonlinearity can be controlled by adjusting the chirp of the RF waveform.

The present invention is not limited to the embodiments described above, but all changes and modifications thereof not constituting departure from the spirit and scope of the invention are intended to be included.

What is claimed is:

1. An apparatus for compensating frequency chirp time-dispersion to obtain broad bandwidth ultrashort pulses, comprising:

a wavelength tunable-laser for generating frequency chirped pulses;

optical means arranged in an optical path of said wavelength-tunable laser, including means for compensating at least one order of frequency chirp time-dispersion.

2. An apparatus as claimed in claim 1, wherein said optical means includes a plurality of chirped Bragg gratings arranged in series, each of said gratings compensating at least one order of frequency chirp time-dispersion.

3. An apparatus as claimed in claim 1, wherein said optical means includes at least one in-fiber chirped Bragg grating.

4. An apparatus as claimed in claim 3, wherein a plurality of said in-fiber chirped Bragg gratings are arranged in series.

5. An apparatus as claimed in claim 3, wherein said optical means includes a plurality of said in-fiber chirped Bragg gratings overlapped within said fiber, each of said gratings compensating a different order of frequency chirp time-dispersion.

6. An apparatus as claimed in claim 1, wherein said optical means is arranged within the cavity of said wavelength-tunable laser.

7. An apparatus as claimed in claim 1, wherein said optical means is arranged externally of the cavity of said wavelength-tunable laser.

8. An apparatus as claimed in claim 1, further comprising electrical means for compensating at least one other order of frequency chirp time-dispersion.

9. An apparatus as claimed in claim 8, wherein said electrical means comprises a pulse signal source, splitting means for dividing said pulse signal, a plurality of compensation channels, connected in series to said splitting means and in parallel to each other, each for creating a specific order effect on said signal, means for combining the outputs of said compensation channels, and means for applying said combined output to a driving input of said wavelength-tunable laser.

10. An apparatus as claimed in claim 1, wherein said compensating means comprises a chirped Bragg grating having a chirp profile.

11. An apparatus for compensating frequency chirp time-dispersion to obtain broad bandwidth ultrashort pulses, comprising:

a wavelength-tunable laser for generating frequency chirped optical pulses;

electrical means for compensating at least one order of said frequency chirp time-dispersion, said electrical means comprising a source of pulse signals, at least one compensating channel including means for creating a specific order effect on said signal, and means for applying an output of said at least one compensation channel to a driving input of said wavelength-tunable laser.

12. An apparatus for compensating frequency chirp to obtain broad bandwidths ultrashort pulses, comprising:

a wavelength-tunable laser for generating frequency chirped pulses;

electrical means for compensating at least one order of said frequency chirp, said electrical means comprising a source of pulse signals, splitting means for dividing said pulse signals, a plurality of compensation channels, connected in series to said splitting means and in parallel to each other, each for creating a specific order effect on said signal, means for combining the outputs of said compensation channels, and means for applying said combined output to a dividing input of said wavelength-tunable laser.

13. An apparatus as claimed in claim 12, wherein said compensation channels each comprise integration means for integrating said pulse signal.

14. An apparatus as claimed in claim 12, wherein a first of said compensation channels includes an integrator for creating a linear or first order effect on said pulse signal, and wherein successive ones of said compensation channels include series connected integrators in a number corresponding to the order of the frequency chirp to be compensated.

15. An apparatus as claimed in claim 14, wherein at least one of said integration means comprises a coaxial transmission line, electrically connected in parallel to a capacitor.

16. An apparatus as claimed in claim 12, further including optical means arranged in an optical path of said wavelength-tunable laser, including at least one chirped Bragg grating having a chirp profile designed so as to compensate at least one order of frequency chirp.

17. An apparatus as claimed in claim 16, wherein said optical means comprises at least one nonlinear chirped Bragg grating.

18. An apparatus as claimed in claim 16, wherein said optical means comprises at least a linearly chirped Bragg grating.

19. A method of compensating frequency chirp to obtain broad bandwidth ultrashort pulses from wavelength-tunable lasers, comprising the steps of:
generating a pulse signal;
simultaneously applying said signal to a plurality of compensation channels;
creating a specific order effect on said signal in each of said channels;
combining the outputs of said compensation channels to create an aggregate nonlinear compensation signal; and
applying said compensation signal to a driving input of said wavelength-tunable laser.

20. A method of compensating frequency chirp time-dispersion to obtain broad bandwidth ultrashort pulses, comprising the steps of:
creating an optical path with a wavelength-tunable laser,
arranging an optical means in said optical path of said wavelength-tunable laser, including at least one chirped Bragg grating having a chirp profile to compensate at lest one order of frequency chirp time-dispersion.

21. A method of compensating frequency chirp time-dispersion to obtain broad bandwidth ultrashort pulses from wavelength-tunable lasers, comprising the steps of:
generating a pulse signal;
supplying at least one compensation channel including means for creating a specific order effect on said signal; and
applying an output of said at least one compensation channel to a driving input of said wavelength-tunable laser.

22. A method of compensating frequency chirp to obtain broad bandwidth ultrashort pulses from wavelength-tunable lasers, comprising:
providing a source of pulse signals;
splitting said pulse signals into a plurality of compensation channels arranged in parallel to each other;
creating a specific order effect on said pulse signals in each of said compensation channels;
combining the outputs of said compensation channels; and
applying said combined output to a driving input of said wavelength-tunable laser.

23. A method as claimed claim 22, wherein said specific order effect is created by integrating said signal at least once in at least one of said compensation channels.

24. A method of compensating frequency chirp to obtain broad bandwidth ultrashort pulses from wavelength-tunable lasers, comprising the steps of:
arranging an optical means in an optical path of said wavelength-tunable laser, including at least one chirped Bragg grating having a chirp profile designed so as to compensate at least one order of frequency chirp time-dispersion; and
providing electrical means for compensating at least one other order of frequency chirp time-dispersion.

25. A method as claimed in claim 24, wherein said electrical means generates a pulse signal, splits said pulse signal into compensation channels provided in correspondence with the number of orders of frequency chirp to be compensated by said electrical means, creates a specific order effect on said signal in each of said compensation channels, combines the outputs of said compensation channels, and applies said combined output to a driving input of said wavelength-tunable laser.

26. An apparatus for compensating frequency chirp to obtain broad bandwidth ultrashort pulses from wavelength-tunable lasers, comprising:
optical means arranged in an optical path of said wavelength-tunable laser, including at least one chirped Bragg grating having a chirp profile designed so as to compensate at least one order of frequency chirp; and
electrical means for generating a compensation signal for application to a driving input of said wavelength-tunable laser for compensating at least one other order of frequency chirp.

27. An apparatus for compensating frequency chirp time-dispersion to obtain broad bandwidth ultrashort pulses, comprising:
a wavelength-tunable laser for generating frequency chirped pulses having a spectrum and represented by at least one term;
an optical means arranged in an optical path of said wavelength-tunable laser for compensating said term of said optical pulses, including at least one chirped Bragg grating having a reflection spectrum overlapping with said spectrum of said optical pulses and also having a chirp profile to compensate at least one order of frequency chirp time-dispersion.

28. An apparatus as claimed in claim 27, further comprising electrical means for creating and applying to a driving input of said wavelength-tunable laser an electric waveform for compensating at least one other order of frequency chirp time-dispersion.

29. An apparatus claimed in claim 28, wherein said electrical means comprises:
a pulse signal source for generating an electrical pulse signal having at least one term,
splitting means for dividing said electrical pulse signal into a plurality of compensation channels connected in series to said splitting means and in parallel to each other, each for creating a specific order of correction on said term of said electrical signal, means for combining the outputs of said compensation channels, and means for applying said combined output to said dividing input of said wavelength-tunable laser.

30. An apparatus for compensating frequency chirp time-dispersion to obtain broad bandwidth ultrashort pulses, comprising:

a wavelength-tunable laser for generating frequency chirped optical pulses;

electrical means for compensating at least one order of said frequency chirp time-dispersion, said electrical means comprising a source of an electrical pulse signal having at least one term, at least one compensation channel including means for creating a specific order of correction on said term of said electrical signal, and means for applying an output of said at least one compensation channel to a driving input of said wavelength-tunable laser.

31. An apparatus for compensating frequency chirp time-dispersion to obtain broad bandwidth ultrashort pulses, comprising:

a wavelength-tunable laser for generating frequency chirped pulses;

electrical means for compensating at least one order of said frequency chirp time-dispersion, said electrical means comprising a source of an electrical pulse signal having at least one term, splitting means for dividing said electrical pulse signal into a plurality of compensation channels connected in series to said splitting means and in parallel to each other, each for creating a specific order of correction on said term of said electrical signal, means for combining the outputs of said compensation channels, and means for applying said combined output to a dividing input of said wavelength-tunable laser.

32. An apparatus as claimed in claim 31, further including optical means arranged in an optical path of said wavelength-tunable laser, including at least one chirped Bragg grating having a reflection spectrum overlapping with said spectrum of optical pulses and also having a chirp profile to compensate at least one order of frequency chirp time-dispersion.

\* \* \* \* \*